(12) United States Patent
Duncan et al.

(10) Patent No.: US 12,295,119 B2
(45) Date of Patent: May 6, 2025

(54) SCALABLE COOLING ARCHITECTURE FOR LIQUID AND AIR COOLING

(71) Applicant: Dell Products L.P., Round Rock, TX (US)

(72) Inventors: Tyler Baxter Duncan, Austin, TX (US); Anthony Middleton, Cedar Park, TX (US); Ty Robert Schmitt, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 335 days.

(21) Appl. No.: 17/971,365

(22) Filed: Oct. 21, 2022

(65) Prior Publication Data

US 2024/0138115 A1 Apr. 25, 2024
US 2024/0237289 A9 Jul. 11, 2024

(51) Int. Cl.
*H05K 7/20* (2006.01)

(52) U.S. Cl.
CPC ..... *H05K 7/20327* (2013.01); *H05K 7/20136* (2013.01); *H05K 7/202* (2013.01); *H05K 7/20309* (2013.01); *H05K 7/208* (2013.01)

(58) Field of Classification Search
CPC .......... H05K 7/20327; H05K 7/20136; H05K 7/202; H05K 7/20309; H05K 7/208
USPC .................................................... 361/679.46
See application file for complete search history.

(56) References Cited

U.S. PATENT DOCUMENTS

| | | | |
|---|---|---|---|
| 9,723,762 B1* | 8/2017 | Ross | F24F 13/222 |
| 11,032,948 B1* | 6/2021 | Ross | H05K 7/20745 |
| 2010/0154448 A1* | 6/2010 | Hay | F24F 1/0067 62/119 |
| 2011/0100618 A1* | 5/2011 | Carlson | H05K 7/2079 165/104.33 |
| 2014/0069127 A1* | 3/2014 | Bailey | H05K 7/20745 62/96 |
| 2018/0014434 A1* | 1/2018 | Craft, Jr. | H05K 7/2079 |
| 2018/0324976 A1* | 11/2018 | Gao | H05K 7/20836 |
| 2021/0100134 A1* | 4/2021 | Gao | H05K 7/20781 |

* cited by examiner

*Primary Examiner* — Zhengfu J Feng
(74) *Attorney, Agent, or Firm* — Chamberlain, Hrdlicka, White, Williams & Aughtry; Aly Z. Dossa

(57) ABSTRACT

Multiple systems and devices for providing liquid and air cooling for IT components is disclosed. The system includes a module comprising at least one dry cooler and at least one liquid heat exchange device. The module includes a primary cooling loop with the at least one dry cooler and the at least one liquid heat exchange device. The system also includes a secondary loop that includes the at least one liquid heat exchange device and one or more IT units in a facility. The system includes a path for air cooling the one or more IT units in the facility that includes at least one air intake from outside the facility that supplies air for cooling the one or more IT units.

15 Claims, 11 Drawing Sheets

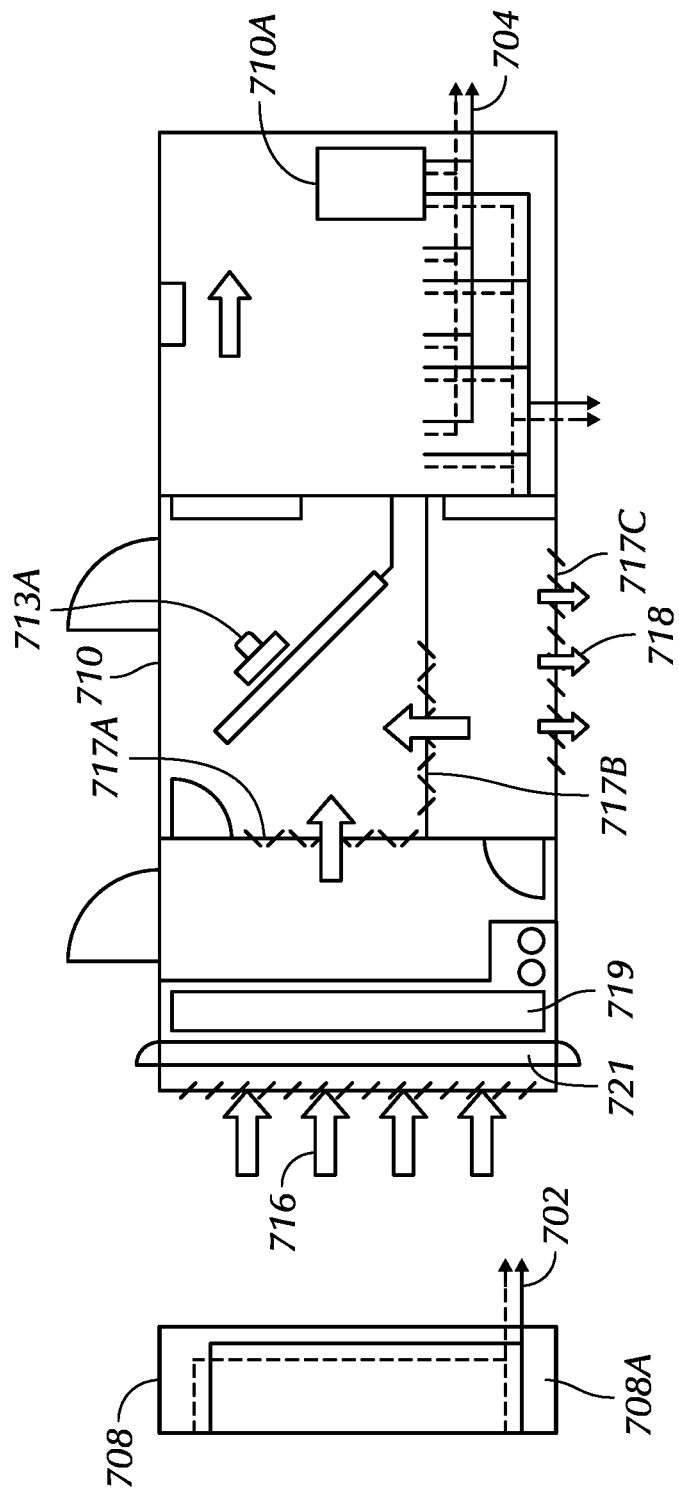
FIG. 7.1

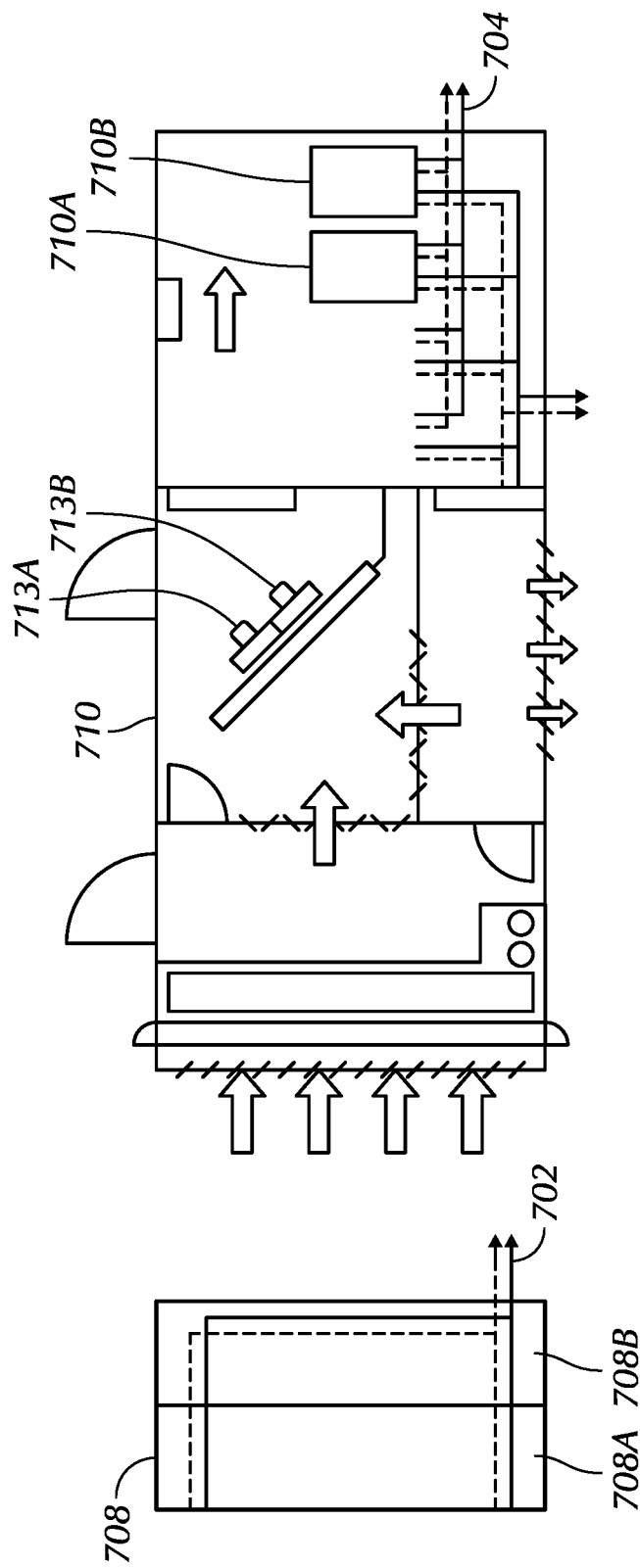
FIG. 7.2

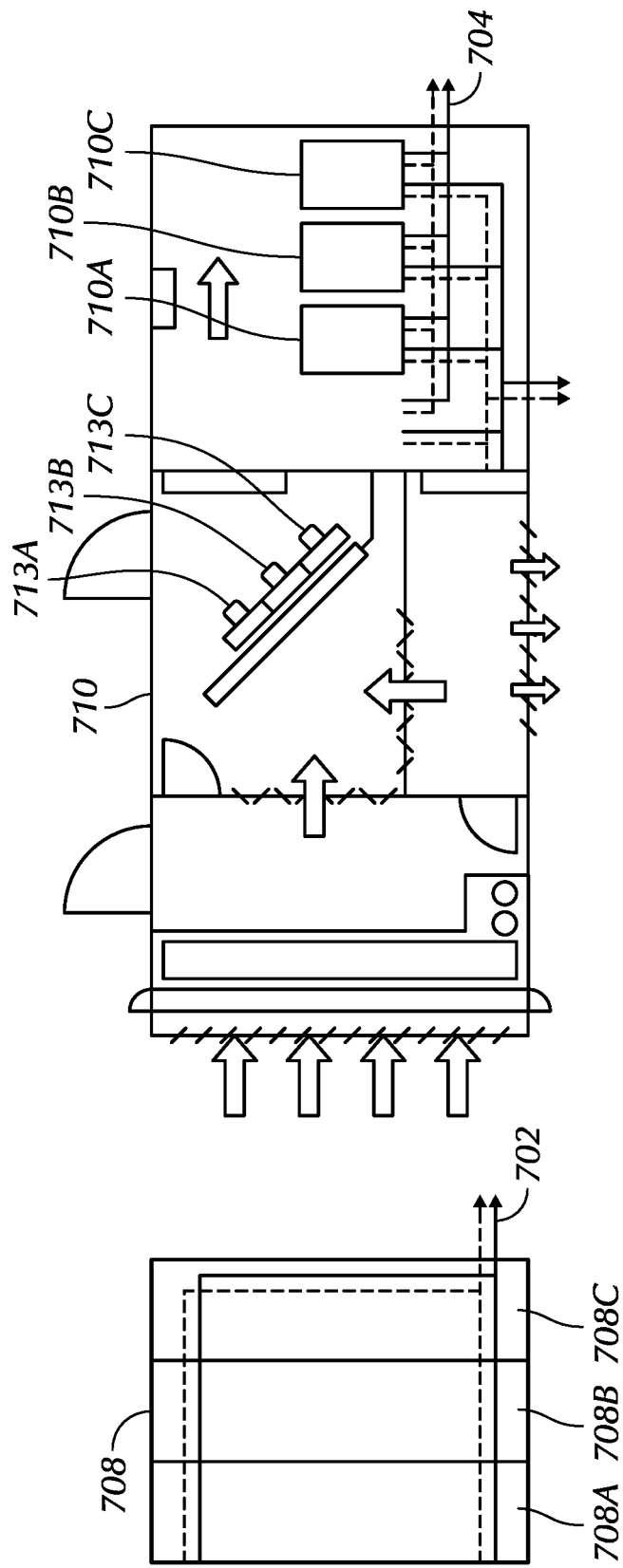
FIG. 7.3

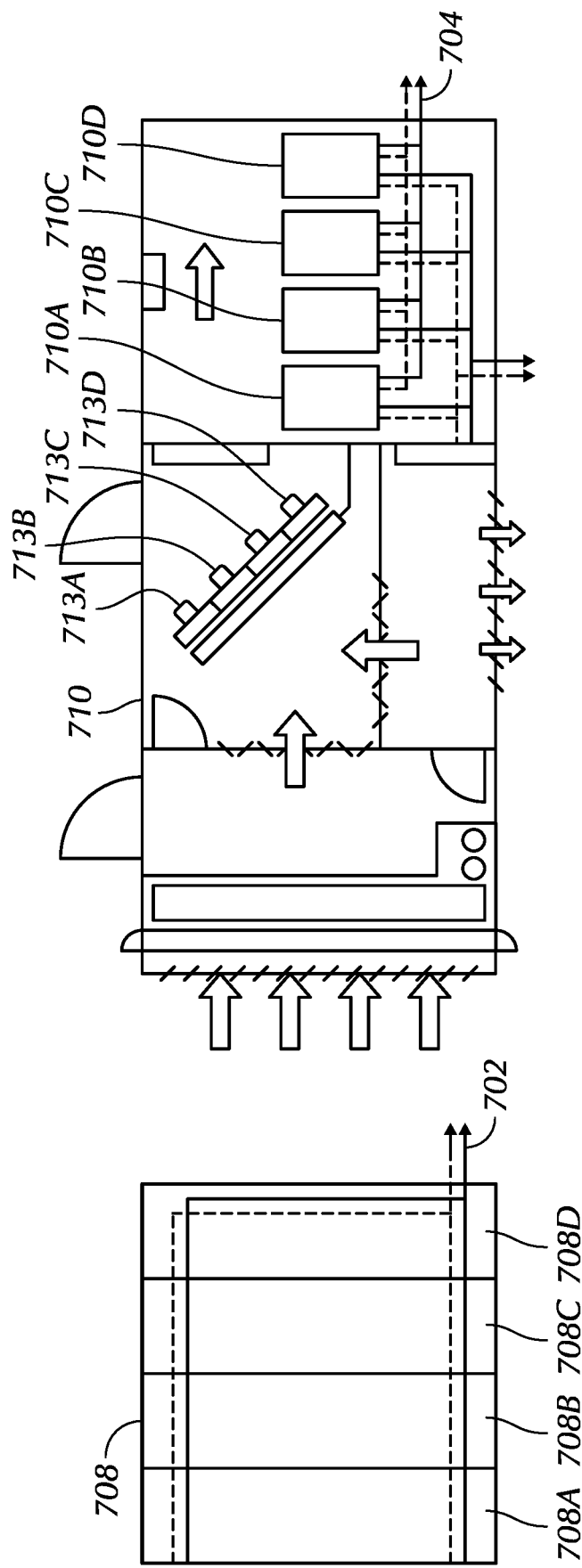
FIG. 7.4

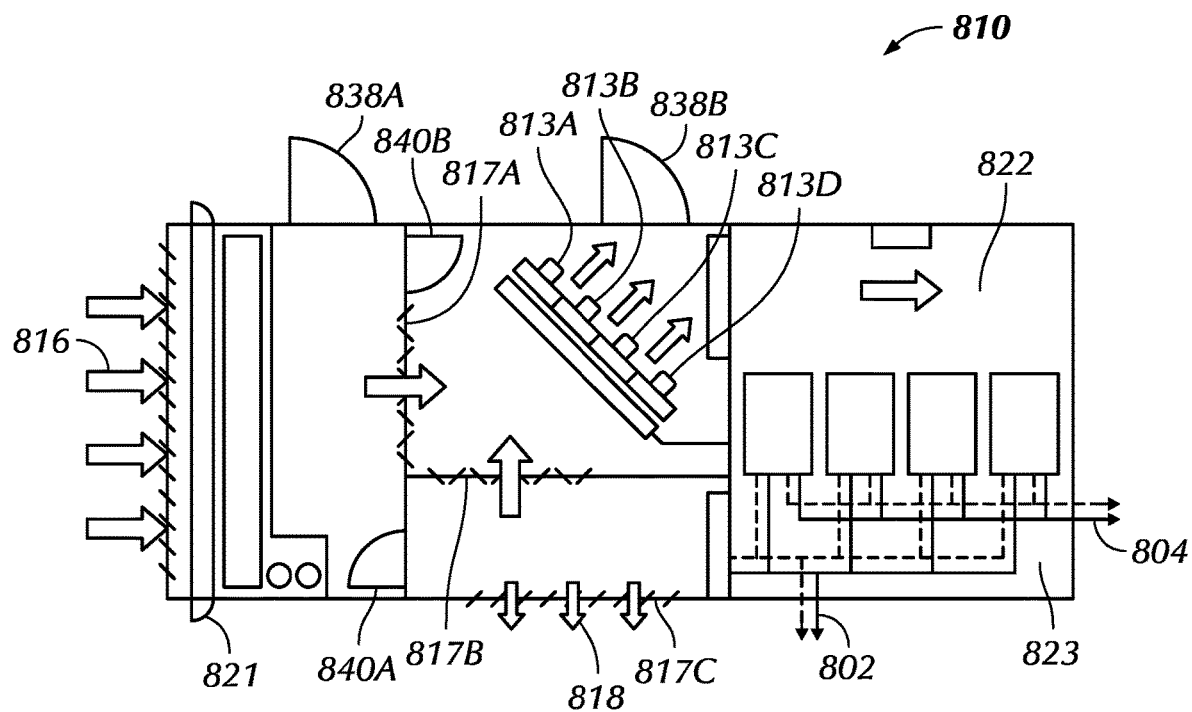
FIG. 8.1
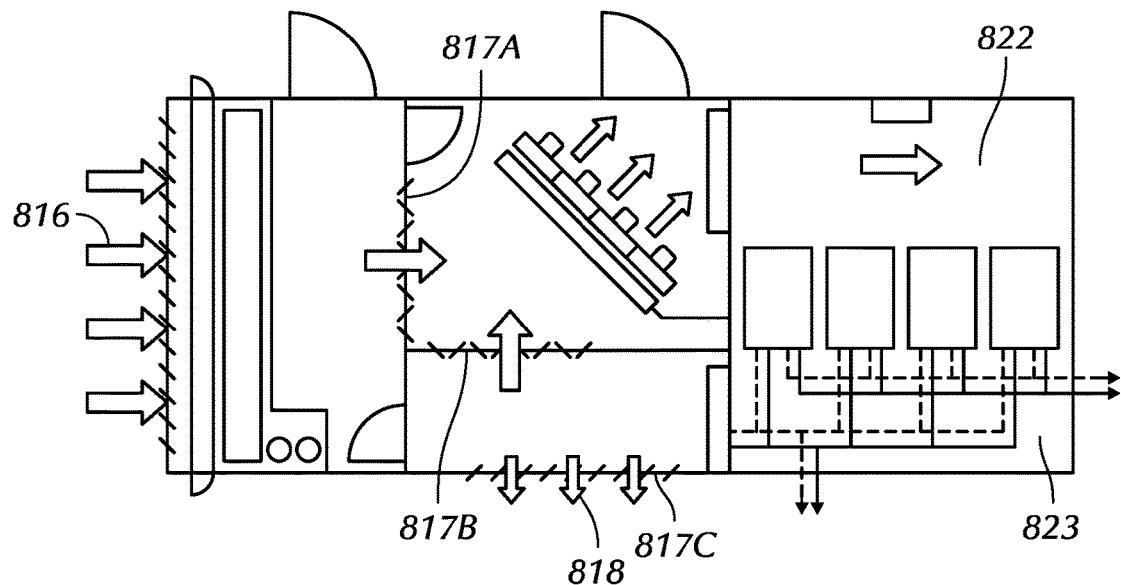
FIG. 8.2

SCALABLE COOLING ARCHITECTURE FOR LIQUID AND AIR COOLING

BACKGROUND

The heterogeneous Information Technology (IT) environments witnessed today often require a mixture of air and liquid cooling. With various technologies prevalent in the liquid cooling space, custom solutions, such as using commercially available industrial HVAC units, are often sized and developed per application load and/or targeted toward a specific supply medium. The custom solutions may require additional custom engineering for each deployment and/or refresh cycle of the IT.

In addition, the ratio of liquid cooling to air cooling often varies greatly from one system to another. Mixed environments that utilize liquid cooled and air cooled racks typically result in custom engineering for each solution. Also, mixed environments may result in an un-optimized cooling solution that leaves capacity, or is short on capacity, either in the liquid or the air cooling side. This problem may be amplified as IT is refreshed by the constant manual tuning of the cooling system that may be required. Further, in mixed environments, the presence of personnel may affect the air temperatures, resulting in temperatures that are detrimental to the IT and/or not safe for the personnel.

SUMMARY

In one aspect, embodiments described herein relate to a system for cooling Information Technology (IT) in a facility that includes a module comprising at least one dry cooler and at least one liquid heat exchange device. The module includes a primary cooling loop with the at least one dry cooler and the at least one liquid heat exchange device. The system also includes a secondary loop that includes the at least one liquid heat exchange device and one or more IT units in the facility. The system includes a path for air cooling the one or more IT units in the facility that includes at least one air intake from outside the facility that supplies air for cooling the one or more IT units.

In another aspect, embodiments described herein relate to a device for cooling Information Technology (IT) in a facility that includes at least one dry cooler, at least one liquid heat exchange device, a primary cooling loop that includes the at least one dry cooler and the at least one liquid heat exchange device, and a secondary loop that includes the at least one liquid heat exchange device and one or more IT units in the facility.

BRIEF DESCRIPTION OF DRAWINGS

Certain embodiments of the technology will be described with reference to the accompanying drawings. However, the accompanying drawings illustrate only certain aspects or implementations of the technology by way of example and are not meant to limit the scope of the claims.

FIGS. 7.1-7.4 show diagrams demonstrating the scalability of a modular system in accordance with one or more embodiments of the technology.

FIGS. 8.1-8.2 demonstrate different cooling schemes in accordance with one or more embodiments of the technology.

DETAILED DESCRIPTION

Figure 1:
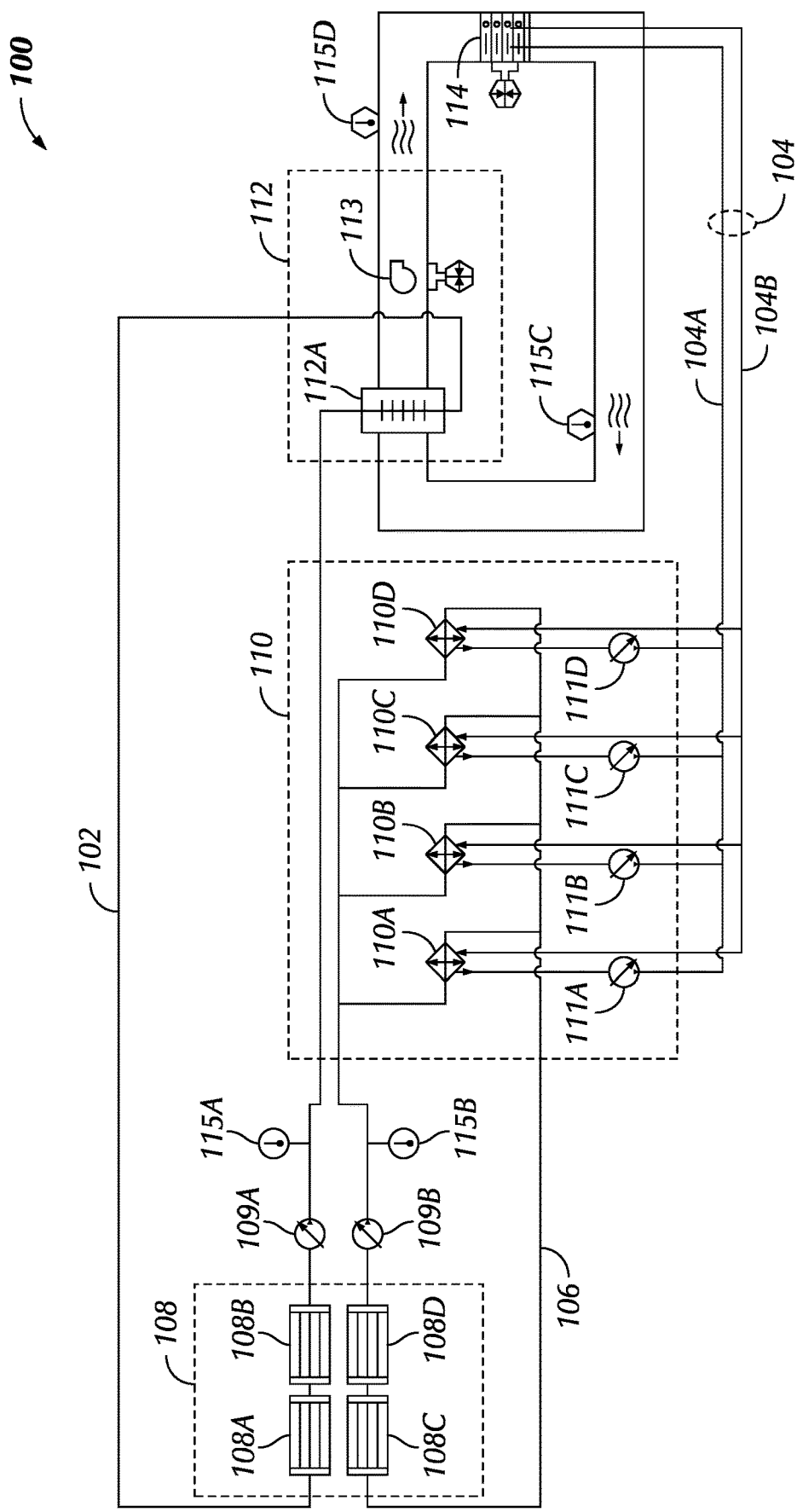
FIG. 1 shows a diagram of a multi-loop system in accordance with one or more embodiments of the technology.

Specific embodiments will now be described with reference to the accompanying figures. In the following description, numerous details are set forth as examples of the technology. It will be understood by those skilled in the art that one or more embodiments of the present technology may be practiced without these specific details and that numerous variations or modifications may be possible without departing from the scope of the technology. Certain details known to those of ordinary skill in the art are omitted to avoid obscuring the description.

In the following description of the figures, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment, which may be implemented in addition to, in conjunction with, or in place of the embodiments described with regard to a corresponding like-named component in any other figure.

In general, embodiments disclosed herein are directed to cooling solutions in an IT environment using cooling modules. In this context, Information Technology (IT) refers to racks, servers, or any computational equipment that may benefit from liquid cooling.

Embodiments of the cooling solutions include cooling modules that may have all the required power transformation and controls for operation and operate autonomously. Such cooling modules may be assembled with the IT at the factory and delivered to the site as a single unit, or the one or more of the cooling modules may be connected to an IT system (provided or previously existing) at a customer site as part of a site assembled solution. Embodiment disclosed herein provide systems that may use air supplied from outside the module to establish the air cooling.

Embodiments disclosed herein use multiple closed liquid cooling loops to establish the liquid cooling. Embodiments may utilize one or more compressor-less dry coolers in a primary loop. Optionally, the dry coolers may use evaporative cooling for heat rejection to an outside environment. Embodiments of the cooling loops also include liquid heat exchange devices (CDUs). The cooling liquid provided by the dry coolers may be used to remove the heat from the CDUs. The CDUs may be a part of a secondary cooling loop to provide direct liquid cooling to the IT.

Embodiments may also include air-liquid heat exchange devices to provide the desired air cooling. An air-liquid heat exchange device may be included in either the primary or secondary cooling loops. Embodiments of the air cooling modules may be a closed air system or an open air system that uses outside air.

The embodiments disclosed herein are directed to a multi-loop liquid and air cooling system with modular and scalable sections to accommodate a multitude of heterogeneous IT deployments. The modules may include a dry cooling module, a liquid loop interface module, an air/liquid exchange module to provide air cooling to IT, and/or an IT module. Each module may be scaled to accommodate the overall cooling needs of the IT. Further, one or more of the modules may be transported to the site for the IT.

Embodiments may be deployed to provide liquid cooling to different types of facilities, in addition to IT modules. For example, embodiments may be deployed for installation into pre-existing air cooled facilities.

FIG. 1 shows a diagram of a multi-loop system in accordance with one or more embodiments disclosed herein. The multi-loop system (100) includes a primary loop (102), a secondary loop (104), and a third loop (106).

The multi-loop system (100) includes a dry cooling section (108), a liquid loop interface (110), and an air/liquid exchange section (112) to provide the cooling to the IT (114). As will be discussed below, each of these sections translated to a scalable module in accordance with embodiments disclosed herein.

The dry cooling section (108) includes one or more dry coolers (108A-108D). The number of dry coolers is not limited, and may be selected based on the cooling requirements and environment (i.e., geography, available space, etc.) The dry coolers are compressor-less coolers and/or evaporative coolers. The dry coolers may use an adiabatic process for cooling a liquid. The dry cooling section (108) includes monitoring and control components, for example dry cooling pumps (109A, 109B) and temperature monitors (115A, 115B).

In FIG. 1, the liquid loop interface (110) is an interface between the secondary loop (104) and the third loop (106). The liquid loop interface (110) includes one or more liquid heat exchange devices (CDUs) (110A . . . 110D). One of ordinary skill in the art will appreciate that the number of CDUs in the liquid loop interface (110) is not limited. The number of CDUs may be selected based on the cooling requirements of the IT, in conjunction with the number of dry coolers.

In these embodiments, the CDUs (110A-110D) provide liquid cooling to the IT (114) via the secondary loop (104). The third loop (106) provides liquid cooling to the CDUs (110A-110D) using dry coolers (108C, 108D) of the dry cooling section (108). For each CDU (110A-110D), a CDU pump (111A-111D) is provided to control the flow in secondary loop (104).

The primary loop (102) provides liquid cooling to the air/liquid exchange section (112). The cooled fluid from the dry cooling section (108) is used to remove heat from the air via an air to liquid heat exchange device (112A). One or more fans (113) may be used to direct the flow of air to and from the IT (114). One or more temperature sensors (115C, 115D) may be used to monitor the air temperature and air cooling conditions in the air/liquid exchange section (112). In the example of FIG. 1, the air system would be considered a closed system (i.e., closed off from any outside air). As will be apparent given the modular nature disclosed herein, embodiments disclosed herein are not limited to closed systems.

In the example of FIG. 1, the primary loop (102) includes two dry coolers (108A, 108B) of the dry cooling section (108) and the air to liquid heat exchange device (112A) of the air/liquid exchange section (112). The secondary loop (104) is the closed liquid loop that includes the CDUs (110A-110D) of the liquid loop interface (110) and the IT (114). The third loop (106) includes two dry coolers (108C, 108D) of the dry cooling section (108) and the CDUs (110A-110D) of the liquid loop interface (110).

In these examples, the primary loop (102) and third loop (106) follow separate paths through the dry cooling section (108). The dry cooling section (108) includes four dry coolers (108A-108D), and the loops are connected such that the primary loop (102) utilizes two of the dry coolers (108A, 108B) and the third loop (106) utilizes the remaining dry coolers (108C, 108D). However, as will be demonstrated below, embodiments disclosed herein are not limited to the number of loops utilizing the dry cooling section (108).

Embodiments of FIG. 1 demonstrate a scalable closed loop cooling solution that includes a primary liquid loop with compressor-less dry coolers that may include an evaporative cooling option for heat rejection to the outside environment, a secondary liquid loop to remove heat from the liquid cooled IT, and an air to liquid heat exchange device to remove heat from the air that provides air cooling to the IT in a single packaged cooling unit. The use of the dry coolers provides an energy efficient removal of heat for both liquid and air cooling sections. However, one of ordinary skill in the art will appreciate that the dry coolers may be replaced with mechanical cooling if lower liquid temperatures are required.

In embodiments disclosed herein, the liquid used in the cooling loops is not limited to any particular fluid. For example, distilled water, glycol solutions (e.g., ethylene glycol, propylene glycol) and mixtures thereof may be used in the cooling loops. Further, different fluids may be used in different cooling loops. For example, the primary cooling loop may use distilled water, while the secondary cooling loop uses a water/glycol mixture.

Figure 2:
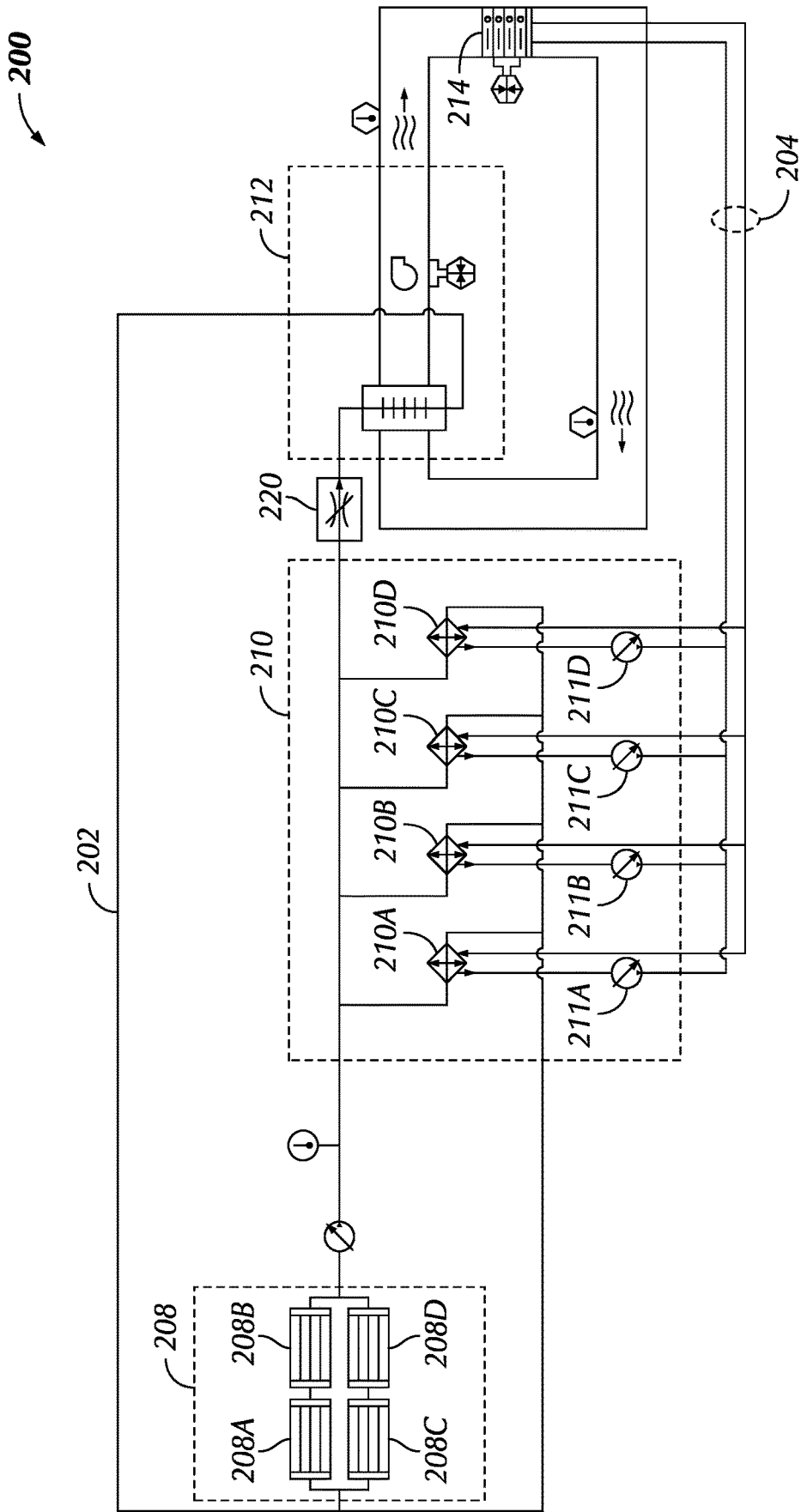
FIG. 2 shows a diagram of a dual loop system in accordance with one or more embodiments of the technology.

FIG. 2 shows a diagram of a dual loop system in accordance with one or more embodiments of the technology. The examples of the dual loop system (200) of FIG. 2 include a dry cooling section (208), a liquid loop interface (210), and an air/liquid exchange section (212) to provide the cooling to the IT (214), similar to the embodiment of FIG. 1.

In FIG. 2, the primary loop (202) includes the dry cooling section (208), the liquid loop interface (210), and the air/liquid exchange section (212). The secondary loop (204) is a closed liquid loop that includes the CDUs (210A-210D) of the liquid loop interface (210) and the IT (214). In FIG. 2, a flow control valve (220) controls the liquid flow in the primary loop (202).

In FIG. 2, the dry cooling section (208) includes four dry coolers (208A-208D) with two dry coolers (208A, 208B) being connected in parallel with the remaining dry coolers (208C, 208D). However, one of ordinary skill in the art will appreciate that the number and arrangement of the dry coolers is not limited.

In embodiments of FIG. 2, the flow control valve (220) may include an air temperature input from the air/liquid exchange section (212) to control the flow of liquid in the primary loop (202). In such embodiments, the flow control valve (220) of the primary liquid loop (202) may engineer the pressure and/or flow, in conjunction with the speed of the CDU pumps (211A-211D), to establish the desired air and liquid cooling.

Figure 3:
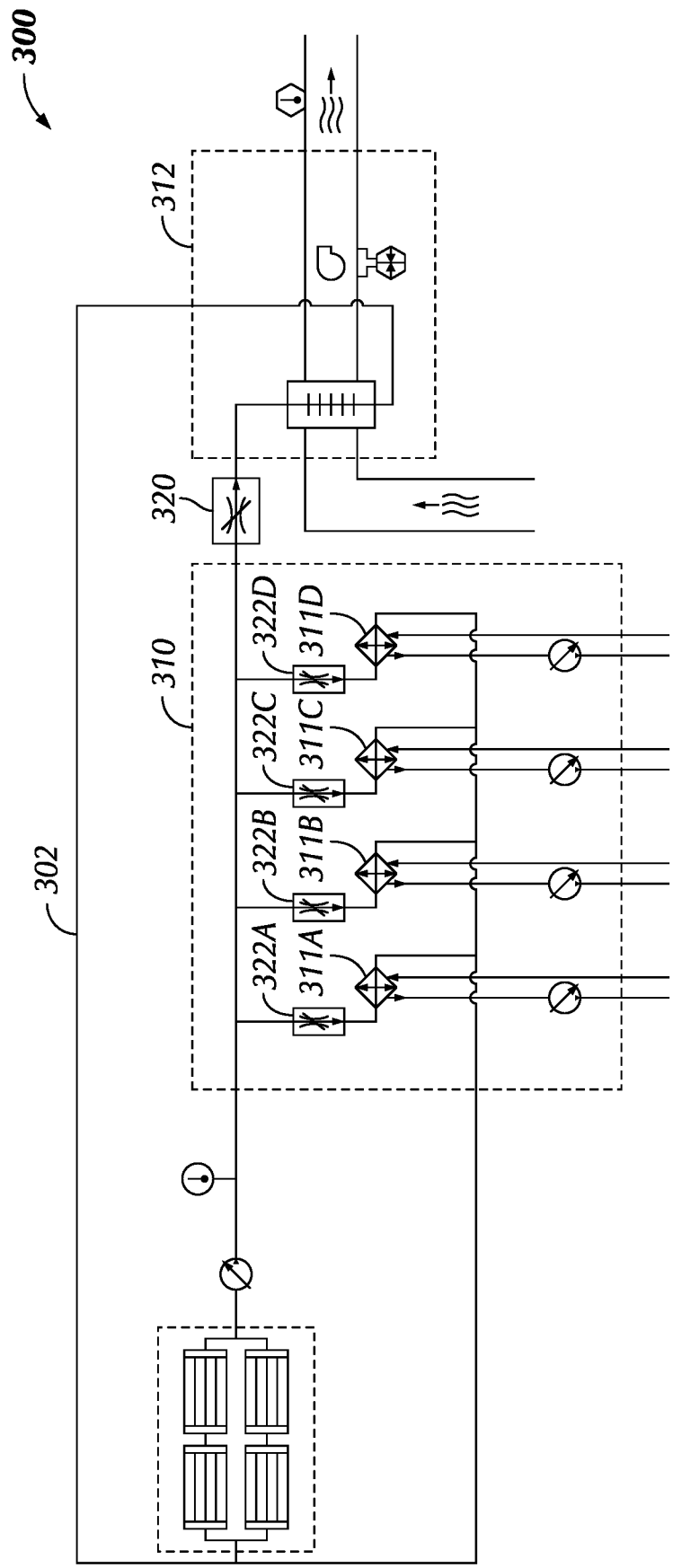
FIG. 3 shows a diagram of a system for adjusting the liquid/air cooling ratio in accordance with one or more embodiments of the technology.

FIG. 3 shows a diagram of a system for adjusting the liquid/air cooling ratio in accordance with one or more embodiments of the technology. The examples demonstrated by the system (300) of FIG. 3 is similar to that of FIG. 2, with the addition of CDU flow control valves (322A-322D) associated with the CDUs (310A-310D) in the primary loop (302). In FIG. 3, the number of CDU flow control valves (322A-322D) is shown as equal to the number of CDUs (310A-310D); however, embodiments are not limited as such. For example, one CDU control valve may service one or more CDUs in accordance with embodiments disclosed herein.

The flow control valves (320, 322A-322D) may be used to control the ratio of liquid cooling, via the secondary loop, to the air cooling provided by the air/liquid exchange section (312), via the primary loop. Such embodiments provide direct control of the amount of cooling provided by the liquid cooling and the amount of cooling provided by the air side cooling. Embodiments may include an air temperature input from the air/liquid exchange section (312) to direct the flow of liquid in the primary loop (302) using the flow control valve (320). Embodiments may also use temperature monitoring in the CDUs (310A-310D), in conjunction with the CDU pumps (311A-311D), to control the cooling in the secondary loop via the CDU control valves (322A-322D).

Figure 4:
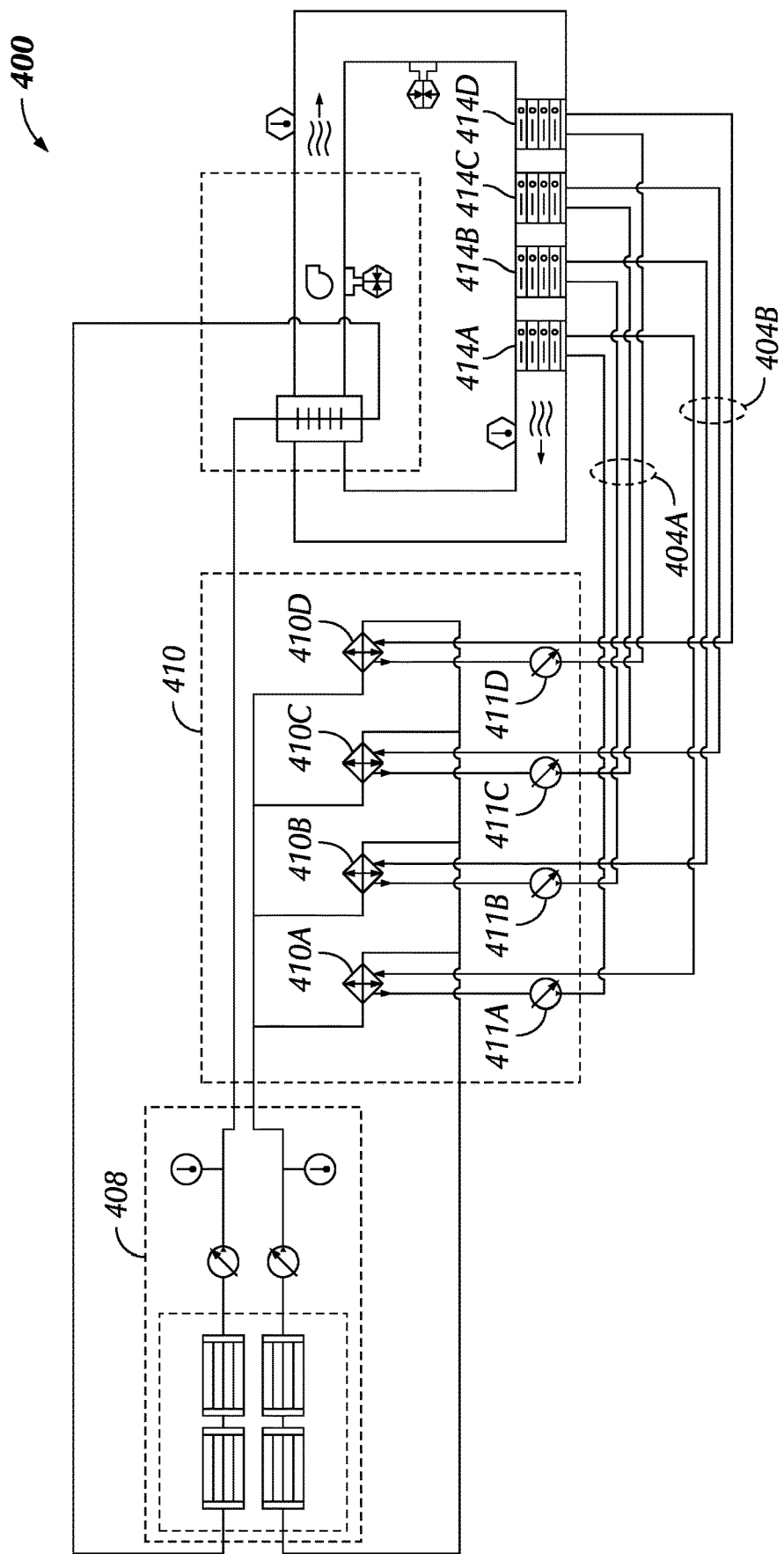
FIG. 4 shows a diagram of a multicomponent system in accordance with one or more embodiments of the technology.

FIG. 4 shows a diagram of a multicomponent system in accordance with one or more embodiments of the technology. The system (400) of FIG. 4 demonstrates that the secondary loop (404) may include multiple IT units (414A-414D). As shown in FIG. 4, the cool side of the secondary loop (404A) follows a path from the CDUs (410A-410D) to the IT units (414A-414D), and the hot side of the secondary path (404B) follows a path from the IT units (414A-414D) back to the CDUs (410A-410D).

In FIG. 4, the number of CDUs is shown with an equal number of IT units; however, embodiments disclosed herein are not limited as such. One of ordinary skill in the art will appreciate that one CDU may service one or more IT units, or more than one CDU may service a single IT unit. The CDU pumps (411A-411D) may be used to control the flow in the secondary loop (404) in accordance with the number and/or type of IT units (414A-414D) serviced by each of the CDUs (410A-410D). Further control may be established using CDU control valves as described in FIG. 2-3 in accordance with embodiments disclosed herein.

The use of dry coolers and multi-loop configurations disclosed herein have lead the inventors to novel, efficient cooling systems. Embodiments disclosed herein have the effect of a Power Usage Effectiveness (PUE) near 1.0. In this context, the PUE refers to the ratio of total power to the IT power required. As such, the most efficient PUE is a value of 1.0, while less efficient systems exhibit a PUE of greater than 1.0 The PUE of previous systems is typically above 1.5, prior to embodiments disclosed herein. Embodiments disclosed herein have a PUE may have a PUE less than 1.3 Some embodiments disclosed herein may exhibit a PUE less than 1.1. Embodiments disclosed herein may exhibit a PUE of 1.01-1.05.

Figure 5:
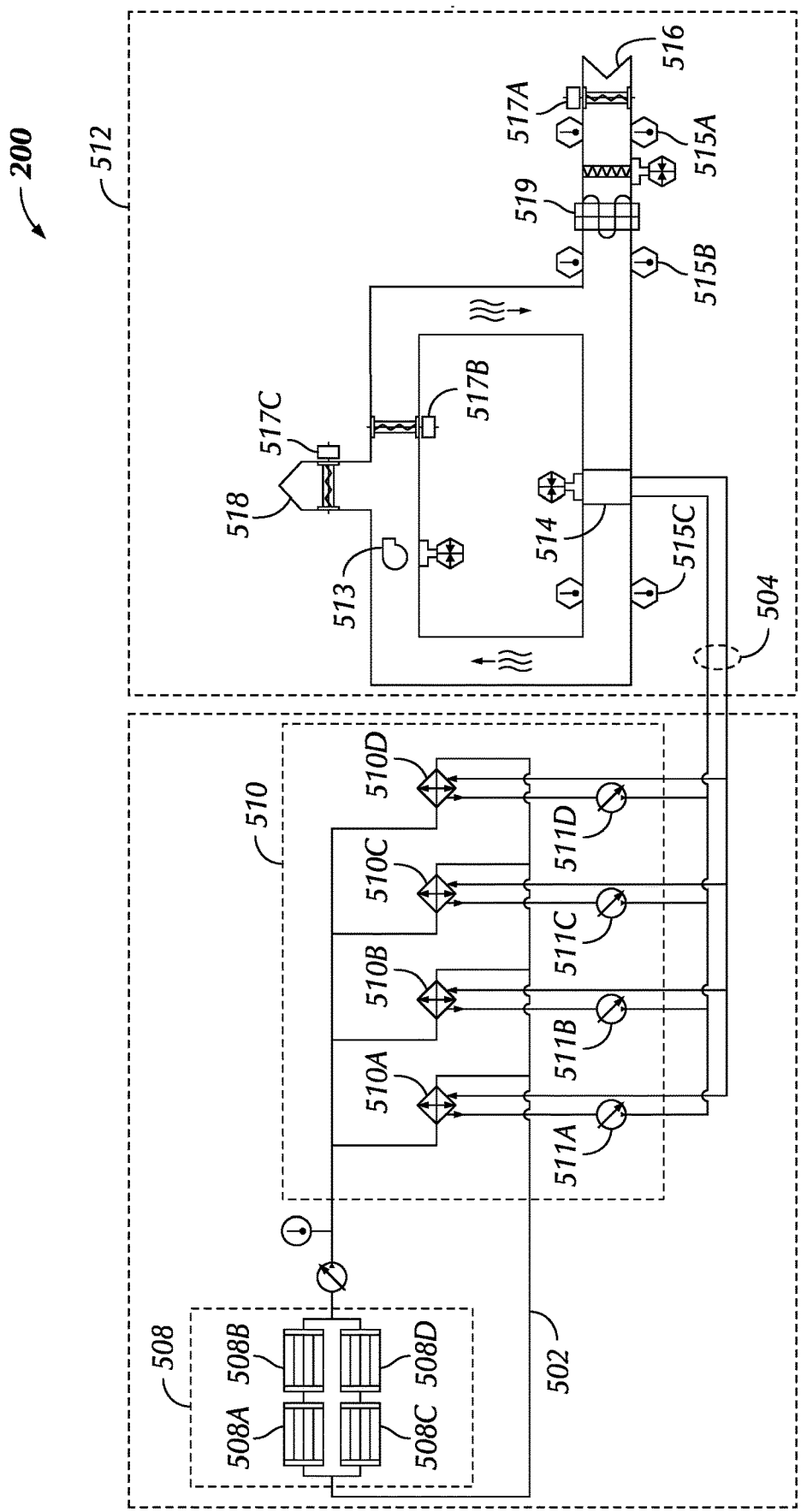
FIG. 5 shows a diagram of a system using outside air in accordance with one or more embodiments of the technology.
Figure 6:
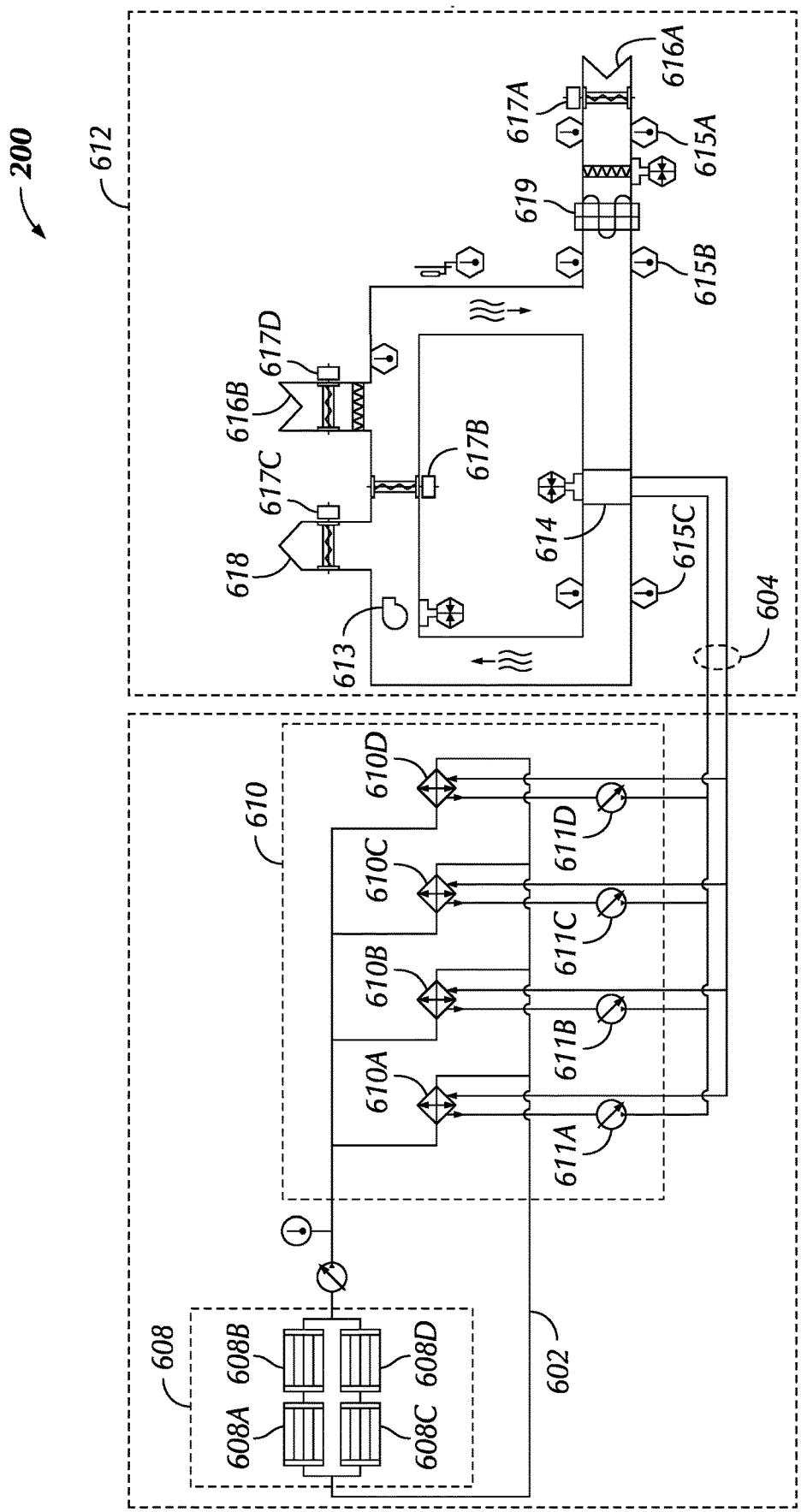
FIG. 6 shows a diagram of a second system using outside air in accordance with one or more embodiments of the technology.

In the embodiments disclosed in FIGS. 1-4, a closed air system is presented, however, embodiments disclosed herein may employ an air system that uses outside air. FIGS. 5-6 show diagrams of systems using outside air in accordance with embodiments of the technology.

FIG. 5 shows a diagram of a system using outside air in accordance with one or more embodiments of the technology. The system (500) includes a dry cooling section (508) with four dry coolers (508A-508D). The liquid interface section (510) includes four CDUs (510A-510D). In these embodiments, the primary loop (502) includes the dry coolers (508A-508D) of the dry cooling section (508) and the CDUs (510A-510D) of the liquid loop interface (510). As shown, the two of the dry coolers (508A, 508B) are connected in parallel to two dry coolers (508C, 508D) along the primary loop (502).

The system (500) includes an air section (512) that houses the IT (514) in an air path. One or more fans (513) may be used to direct the flow of air in the air path. In accordance with embodiments, the outside air enters the air section (512) at the inlet (516). The system includes a plurality of modulating dampeners (517A-517C) to control the flow of air at various points along the air path. More specifically, the dampener (517A) controls the air flow just inside the inlet (516), while the dampener (517C) controls the air flow at the exhaust (518). One of ordinary skill in the art will appreciate that the dampeners work in conjunction to control the air flow in the air flow system. For example, the control of the dampeners may be used to balance the contribution of cooling using the outside air.

One or more temperature sensors (515A-515C) may be used to monitor the air temperature and air cooling conditions at various points in the air section (512). More specifically, the sensor (515A) monitors the conditions just inside the dampener (517A) that is just inside the inlet (516), while the sensor (515C) monitors conditions after the air has contacted the IT (514).

In some embodiments, an additional direct evaporative cooling (DEC) media (519) may be included in the air path. The DEC media (519) is a media that may be used to influence/control the temperature of the air in the air path. The DEC media (519) may be used to raise or lower the temperature of the air as it passes through the media. Additional sensors (515B) may be employed in those embodiments which include the DEC media. One of ordinary skill in the art will appreciate that the DEC media shown in FIG. 5 could be also be an air/liquid exchange device that utilizes the dry cooling section (508) and liquid interface section (510) to cool the air, similar to the embodiments demonstrated in FIGS. 1-2.

In the embodiments of FIG. 5, the secondary loop (504) provides liquid cooling to the IT (514), but there are no air-liquid exchange devices cooled using the primary loop (502) or secondary loop (504). This may provide for an increase in efficiency under certain conditions, as there is no heat loss due to the presence of the air-liquid heat exchange devices. However, embodiments that utilize outside air for cooling are dependent on the outside environment. The environmental conditions, e.g., temperature, humidity, etc., may limit the use of outside air. For example, a liquid loop temperature above the dew point may be necessary to avoid condensation. Also, certain IT components may be especially sensitive to humid conditions. Such components may have humidity requirements in a range that is not conducive to using the outside air in certain environments. Accordingly, using the outside air for cooling may be dependent on the environment and the specific IT being cooled in accordance with embodiments disclosed herein.

FIG. 6 shows a diagram of a second system using outside air in accordance with one or more embodiments of the technology. Similar to FIG. 5, the system (600) includes a dry cooling section (608) with four dry coolers (608A-

608D). The liquid interface section (610) includes four CDUs (610A-610D). In these embodiments, the primary loop (602) includes the dry coolers (608A-608D) of the dry cooling section (608) and the CDUs (610A-610D) of the liquid loop interface (610). As shown, the two of the dry coolers (608A, 608B) are connected in parallel to two dry coolers (608C, 608D) along the primary loop (602). The secondary loop (604) includes the CDUs (610A-610D) of the liquid loop interface (610) and the IT (614) of the air section (612).

The system (600) includes the air section (612) that houses the IT (614) in an air path. One or more fans (613) may be used to direct the flow of air in the air path. In accordance with embodiments, the outside air may enter the air section (612) at the first inlet (616A) and/or the second inlet (616B). The system (600) includes a plurality of modulating dampeners (617A-617D) to control the flow of air at various points along the air path. More specifically, the dampener (617A) controls the air flow just inside the first inlet (616A); the dampener (617C) controls the air flow at the exhaust (618); and the dampener (617D) controls the air flow at the second inlet (616B). One of ordinary skill in the art will appreciate that the dampeners work in conjunction to control the air flow in the air flow system. For example, the control of the dampeners may be used to balance the contribution of air received from the first inlet (616A) and the second inlet (616B).

One or more temperature sensors (615A-615C) may be used to monitor the air temperature and air cooling conditions at various points in the air section (612). More specifically, the sensor (615A) monitors the conditions just inside the dampener (617A) that is just inside the first inlet (616A), while the sensor (515C) monitors conditions after the air has contacted the IT (514).

In some embodiments, an additional direct evaporative cooling (DEC) media (619) may be included in the air path. Additional sensors (615B) may be employed in those embodiments which include the DEC media. One of ordinary skill in the art will appreciate that the DEC media shown in FIG. 6 could be also be an air/liquid exchange device that utilizes the dry cooling section (608) and liquid interface section (610) to cool the air, similar to the embodiments demonstrated in FIGS. 1-2.

In embodiments of FIG. 6, two inlets (616A, 616B) are disclosed to provide air from two separate locations. In accordance with embodiments disclosed herein, the air supplied through an inlet may be provided using additional equipment, such as fans, air conditioning units, etc. For example, the inlet (616A) of FIG. 6 may be open to the outside environment (with or without a fan to provide air movement), while the inlet (616B) is open to an air conditioning unit, such as a swamp cooler (not shown).

As previously described, using the outside air for cooling may be dependent on the environment and the specific IT being cooled in accordance with embodiments disclosed herein. Embodiments of FIG. 6 that include multiple inlets where one of the inlets is open to an additional unit, such as a swamp cooler, may be used to help compensate for environmental changes, such as seasonal temperatures, in some environments.

The sections described herein may be arranged in modules and scaled to accommodate the different needs for heterogeneous IT environments. FIGS. 7.1-7.4 show diagrams demonstrating the scalability of a modular system in accordance with one or more embodiments of the technology.

In FIG. 7.1, a dry cooling module (708) includes one dry cooler (708A) attached to a liquid interface module (710) that includes one CDU (710A). The module (710) uses air supplied from outside the module to provide air cooling in accordance with embodiments disclosed herein. The module (710) includes an inlet (716) that provides air from an outside source. The air passing through the inlet may be filtered using a filter (721). In some embodiments, the air passing through the inlet (716) may also traverse a DEC media (719) to further modify the properties of the incoming air. The module (710) includes a fan (613A) to provide air movement and controllable vents (717A-717C) to control the air flow inside the module (710). The flow of air in such embodiments is discussed in further detail in FIGS. 8.1-8.2.

In FIG. 7.1, the primary liquid loop (702) includes the dry cooler (708A) and the CDU (710A). The secondary loop (704) includes the CDU (710A) and IT units (not shown). FIG. 7.1 may be assembled and deployed on a single skid transported by conventional means. Alternatively, the dry cooling module (708) and liquid interface module (710) may be assembled and transported separately for deployment.

In FIG. 7.2, the dry cooling module (708) includes two dry coolers (708A, 708B); the module (710) includes two CDUs (710A, 710B) and two fans (713A, 713B). The primary liquid loop (702) includes the dry coolers (708A, 708B) and the CDUs (710A, 710B). The secondary loop (704) includes the CDUs (710A, 710B) and the IT units (not shown).

In FIG. 7.3, the dry cooling module (708) includes three dry coolers (708A, 708B, 708C). The module (710) includes three CDUs (710A, 710B, 710C) and three fans (713A, 713B, 713C). The primary liquid loop (702) includes the dry coolers (708A, 708B, 708C) and the CDUs (710A, 710B, 710C). The secondary loop (704) includes the CDUs (710A, 710B, 710C) and IT units (not shown).

In FIG. 7.4, the dry cooling module (708) includes four dry coolers (708A-708D). The module (710) includes four CDUs (710A-710D) and four fans (713A-713D). The primary liquid loop (702) includes the dry coolers (708A-708D) and the CDUs (710A-710D). The secondary loop (704) includes the CDUs (710A-710D) and the IT units (not shown).

Although FIGS. 7.1-7.4 show an equal numbers of dry coolers, CDUs, and fans, embodiments disclosed herein are not limited as such. For example, the number of fans may outnumber the number of CDUs and/or dry coolers. Further, the number of CDUs may outnumber the number of dry coolers, or vise versa. Rather, FIGS. 7.1-7.4 demonstrate that each module is scalable according to the desired cooling, available space, and deployment strategies in accordance with embodiments disclosed herein.

In embodiments disclosed herein, the number of connections between the modules primarily consists of liquid connections to establish the multiple liquid loops. Other connections, such as power supply lines and/or sensor lines, may also traverse the module splits in accordance with embodiments disclosed herein.

FIGS. 7.1-7.4 demonstrate the modular aspects of the cooling system in accordance with embodiments disclosed herein. The modules may be constructed individually in accordance with embodiments disclosed herein. The modules may be deployed to a site individually, or assembled prior to deployment to the site. The modules, assembled or individually, may be established on a skid and transported to the site in accordance with embodiments disclosed herein. In such embodiments, the final assembly of the system may be completed at the deployment destination. The modules may include integrated shock/vibration isolation to aide in the transportation of modules and deployment.

FIGS. 8.1-8.2 demonstrate different cooling schemes in accordance with one or more embodiments of the technology. The examples of FIGS. 8.1-8.2 are shown using the equipment shown in the module (710) of FIG. 7.4, but are applicable regardless of the number of dry coolers, CDUs, and fans in the module in accordance with embodiments disclosed herein.

In FIG. 8.1, air from outside the module (810) flows into the module (810) through the inlet (816). The air passes through a filter (821) and may pass through a DEC media (819) into a first chamber (A). As shown, the first chamber (A) may include access (838A) to allow access to the filtration system and DEC media from outside the module (810). The module (810) also includes access points (840A, 840B) to allow access from the first chamber (A) to the other chambers (B, C).

The air passes through the first chamber (A) into the second chamber (B) through a controllable vent (817A). The fans (813A-813D) in the second chamber (B) push the air into a cold aisle (822). The cold aisle (822) may be a cold aisle of IT units (not shown) or connected to another module/facility to provide the air to IT units. After the air is heated from cooling the IT, the air moves to a third chamber (C) via the hot aisle (823). The third chamber (C) includes a vent (817C) to outside of the module (810) which provides an exhaust (818) of the module (810). The third chamber (C) also includes a vent (817B) which recirculates the air back to the second chamber (B). By controlling the vents (817A-817C), the flow of air may be controlled based on the particular environmental conditions and cooling requirements.

In FIG. 8.1, the air flows through the inlet (816) into the first chamber (A), through the vent (817A) into the second chamber (B), and into the cold aisle (822). The heated air flows from the hot aisle (823) into the third chamber (C) and exits the module (810) through the exhaust (818) using the vent (817C). The vent (817B) is closed to prevent the hot air from recirculating back into the second chamber (B).

If the air supplied into the inlet (816) that is in a temperature/humidity range conducive to air cooling, the air may simply flow into the first chamber (A). If the air supplied into the inlet (816) is in a hotter temperature range, the DEC media (819) may be used to cool the air as it flows into the first chamber (A).

FIG. 8.2 demonstrates the flow of air if the supplied air into the inlet (816) is in a colder temperature range. For example, if the module is deployed in a colder environment, or if the air is supplied from a separate air conditioning unit, the air may enter the inlet (816) at a temperature too cold for direct air cooling (without inducing condensation).

In FIG. 8.2, the air flows through the inlet (816) into the first chamber (A), through the vent (817A) into the second chamber (B), and into the cold aisle (822). The heated air flows from the hot aisle (823) into the third chamber (C) and exits the module (810) through the exhaust (818) using the vent (817C). The vent (817B) is opened to allow the hot air to recirculating back into the second chamber (B). That is, in the second chamber (B), the hot air from the vent (817B) mixes with the colder air from the vent (817A), to bring the air to a temperature conducive to air cooling.

In embodiments disclosed herein, the sections (i.e., the dry cooling section, the liquid loop interface, air/liquid exchange section, and IT section) may be partially assembled onto one or more skids for deployment. For example, the dry cooling section and liquid loop interface may be assembled and deployed on a single skid, or the dry cooling section, the liquid loop interface, and air/liquid exchange section may be assembled and then deployed on a single skid. In such embodiments, the final assembly of the system may be completed at the deployment destination.

Embodiments disclosed herein provide an efficient, modular, liquid and/or air cooling systems that may use outside air sources. The modular and scalable versatility of embodiments disclosed herein provides for efficient liquid and closed air cooling suitable for many heterogeneous deployments. Embodiments disclosed herein provide a combination of liquid and air cooling, where the ratio of cooling provided by the liquid to the air may be controlled. Embodiments disclosed herein also provide a system with a PUE of slightly greater than one. Embodiments of the modular system may provide cooling facilities that may be deployed to accommodate existing facilities that contain IT.

While the technology has been described above with respect to a limited number of embodiments, those skilled in the art, having the benefit of this disclosure, will appreciate that other embodiments can be devised which do not depart from the scope of the technology as disclosed herein. Accordingly, the scope of the technology should be limited only by the attached claims.

What is claimed is:

1. A system for cooling Information Technology (IT) in a facility, the system comprising:
  a module comprising at least one dry cooler and at least one liquid heat exchange device,
    the module comprising a primary cooling loop comprising the at least one dry cooler and the at least one liquid heat exchange device;
  a secondary loop comprising the at least one liquid heat exchange device and one or more IT units in the facility; and
  a path for air cooling the one or more IT units in the facility, the path comprising:
    at least one air intake from outside the facility that supplies air for cooling the one or more IT units;
    one or more fans to direct a flow of air in the path;
    one or more modulating dampeners to control the flow of air in the path, wherein a first modulating dampener of the one or more modulating dampeners controls the flow of air from the at least one air intake; and
    a second air intake that takes air from outside the facility, wherein a second modulating dampener of the one or more modulating dampeners controls the flow of air from the second air intake.

2. The system of claim 1, wherein the path for air cooling further comprises:
  a direct evaporative cooling (DEC) media.

3. The system of claim 1, wherein the module is deployed on a single skid.

4. The system of claim 1, wherein a Power Usage Effectiveness (PUE) is less than 1.3.

5. The system of claim 1, wherein the facility is a pre-existing air cooled environment.

6. The system of claim 1, wherein the system supplies liquid cooling to at least one air to liquid heat exchange device in the facility, wherein the path comprises the at least one air to liquid heat exchange device.

7. The system of claim 1, further comprising vibration isolation of the at least one dry cooler.

8. A device for cooling Information Technology (IT) in a facility, the device comprising:
  at least one dry cooler;

at least one liquid heat exchange device;
a primary cooling loop comprising the at least one dry cooler and the at least one liquid heat exchange device;
a secondary loop comprising the at least one liquid heat exchange device and one or more IT units in the facility;
a path for air cooling the one or more IT units in the facility, the path comprising:
  at least one air intake from outside the facility that supplies air for cooling the one or more IT units;
  one or more fans to direct a flow of air in the path;
  one or more modulating dampeners to control the flow of air in the path, wherein a first modulating dampener of the one or more modulating dampeners controls the flow of air from the at least one air intake; and
  a second air intake that takes air from outside the facility, wherein a second modulating dampener of the one or more modulating dampeners controls the flow of air from the second air intake.

9. The device of claim 8, wherein the device comprises four dry coolers that supply liquid cooling to a second module.

10. The device of claim 8, wherein the device comprises four liquid heat exchange devices that supply liquid cooling to the facility.

11. The device of claim 8, wherein the device is deployed on a single skid.

12. The device of claim 8, wherein the at least one dry cooler is contained in a first module, and the at least one liquid heat exchange device is contained in a second module.

13. The device of claim 8, wherein a Power Usage Effectiveness (PUE) is less than 1.3.

14. The device of claim 8, wherein the device supplies liquid cooling to at least one air to liquid heat exchange device in the facility, wherein the path comprises the at least one air to liquid heat exchange device.

15. The device of claim 8, further comprising vibration isolation of the at least one dry cooler.

* * * * *